United States Patent
Khater et al.

(10) Patent No.: US 12,139,804 B2
(45) Date of Patent: Nov. 12, 2024

(54) SYSTEMS AND METHODS FOR HIGH-RATE ELECTROCHEMICAL ARSINE GENERATION

(71) Applicant: Utica Leaseco, LLC, Rochester Hills, MI (US)

(72) Inventors: Nabil A. Khater, San Jose, CA (US); Kuanping Gong, Union City, CA (US); Chaowei Wang, San Diego, CA (US); Daniel Mark Dobkin, Sunnyvale, CA (US)

(73) Assignee: Utica Leaseco, LLC, Rochester Hills, MI (US)

( * ) Notice: Subject to any disclaimer, the term of this patent is extended or adjusted under 35 U.S.C. 154(b) by 363 days.

(21) Appl. No.: 17/472,075

(22) Filed: Sep. 10, 2021

(65) Prior Publication Data

US 2022/0090275 A1    Mar. 24, 2022

Related U.S. Application Data

(60) Provisional application No. 63/076,582, filed on Sep. 10, 2020.

(51) Int. Cl.
| | |
|---|---|
| C25B 9/30 | (2021.01) |
| C23C 16/448 | (2006.01) |
| C25B 1/01 | (2021.01) |
| C25B 11/034 | (2021.01) |
| C25B 11/061 | (2021.01) |
| C25B 11/075 | (2021.01) |
| C25B 15/08 | (2006.01) |

(52) U.S. Cl.
CPC .......... *C25B 9/303* (2021.01); *C25B 1/01* (2021.01); *C25B 11/034* (2021.01); *C25B 11/061* (2021.01); *C25B 11/075* (2021.01); *C25B 15/085* (2021.01); *C23C 16/448* (2013.01)

(58) Field of Classification Search
None
See application file for complete search history.

(56) References Cited

U.S. PATENT DOCUMENTS 3,945,905 A  *  3/1976  Persson ............... C25B 11/034
                                              204/272
5,439,567 A  *  8/1995  Cook ................... C02F 1/46104
                                              204/276

(Continued)

*Primary Examiner* — Louis J Rufo
(74) *Attorney, Agent, or Firm* — ARENTFOX SCHIFF LLP (57) ABSTRACT

A system and method for generating arsine are disclosed. The system may include a shell having a top interior surface. The system may also include a cathode-anode assembly positioned in the shell and forming an elongated structure substantially parallel to the top surface. The cathode-anode assembly may include a first electrode and a second electrode surrounding the first electrode and forming a gap therebetween. The second electrode may include a plurality of channels along a length of the second electrode. The plurality of channels may allow circulation of electrolyte within and around at least a portion of the cathode-anode assembly and allow gases generated in response to current applied to the cathode-anode assembly to escape from the cathode-anode assembly. Such gases may be used as precursor gases for a high-volume metal-organic chemical vapor deposition (MOCVD) operation.

20 Claims, 5 Drawing Sheets

(56) References Cited

U.S. PATENT DOCUMENTS

2009/0159454 A1\* 6/2009 Machado ................ C25B 15/02
                                                    204/260
2020/0208281 A1\* 7/2020 Park ...................... C25B 11/057

\* cited by examiner

SYSTEMS AND METHODS FOR HIGH-RATE ELECTROCHEMICAL ARSINE GENERATION

CROSS-REFERENCE TO RELATED APPLICATION(S)

This application claims the benefit of U.S. Provisional Application No. 63/076,582, entitled "Systems and Methods for High-Rate Electrochemical Arsine Generation" and filed on Sep. 10, 2020, which is expressly incorporated by reference herein in its entirety.

BACKGROUND

Technical Field

The present disclosure relates generally to generating gases for semiconductor processing operations, and more particularly, to systems and methods for high-rate electrochemical arsine generation.

Introduction

Arsine, in the form of arsine gas, may be employed for growth of gallium-arsenide (GaAs) and other compound semiconductors by metal-organic chemical vapor deposition (MOCVD). Techniques for synthesis of arsine include aqueous reduction of various arsenic compounds, and extensive purification thereafter. These techniques typically use an arsine manufacturing facility separate from arsine utilization facilities (e.g. semiconductor manufacturing facility).

Various approaches have been suggested to generate arsine at or near the point of use. Some techniques involve the use of dissolved ionic moieties as sources for arsenic, which may allow supplies of a precursor to be stored separately from an electrochemical chamber and pumped into the electrochemical chamber when needed. However, preferred precursors, such as oxides of arsenic, are roughly ten times more toxic than elemental arsenic. Further, most of the work from this technique produces relatively modest yield of arsine versus hydrogen, and thus results in a low overall current efficiency.

As another example, some techniques involve the use of elemental arsenic sacrificial electrodes in alkaline electrolytes. This technique may use arrays of electrodes along with a single cathode to generate arsine in hydrogen. Efficient utilization of the arsenic cathode is important in an economically-viable process, due to the high cost of ultrapure arsenic required to provide high arsine yield. Such efficient utilization has been demonstrated for vertically-oriented cylindrical cathodes without the aid of forced electrolyte flow at low current densities, such as 14 mA/cm2, as described, for example, in U.S. Pat. No. 8,021,536 to Machado et. al. However, single-cathode arrangements may not be scalable for high output rates of arsine and additionally may result in uncontrolled (or undesirable) temperature increases.

An array of vertically-disposed electrodes may be used. Even when an array of vertical electrodes is available, higher current densities, such as 100 to 300 $mA/cm^2$, must be employed to construct a practical gas generator. However, vertical electrodes operated at high current density may be consumed non-uniformly along their height due to combined effects of heat transport and bubble accumulation and may lead to reduced arsenic cathode utilization, even with the addition of forced electrolyte flow.

Accordingly, there exists a need for further improvements to systems and methods for arsine generation.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect, a gas generator is presented. The gas generator may include a shell having a top interior surface and a bottom interior surface opposite the top interior surface. The gas generator may also include a cathode-anode assembly horizontally positioned in the shell and forming an elongated structure substantially parallel to the top interior surface and the bottom interior surface. The cathode-anode assembly may include a first electrode and a second electrode surrounding the first electrode and forming a gap between the second electrode and the first electrode. The second electrode may include a plurality of channels along a length of the second electrode, one or more first channels of the plurality of channels being open towards the top interior surface of the shell, wherein the plurality of channels allow circulation of electrolyte within and around at least a portion of the cathode-anode assembly, and the one or more first channels allow gases, generated in response to current applied to the cathode-anode assembly and directed towards the one or more first channels, to escape from the cathode-anode assembly.

In another aspect, a cathode-anode assembly is presented. The cathode-anode assembly may include a first electrode forming an elongated structure. The cathode-anode assembly may also include a second electrode forming a second elongated structure surrounding the first electrode and forming a gap between the second electrode and the first electrode, the second electrode including a plurality of channels along a length of the second electrode, one or more first channels of the plurality of channels open towards a first direction which is substantially vertical, wherein the plurality of channels allow circulation of electrolyte within and around at least a portion of the cathode-anode assembly and the one or more first channels allow gases, generated in response to current applied to the cathode-anode assembly and directed towards the one or more first channels, to escape from the cathode-anode assembly in the first direction.

In another aspect, a method for generating gas is presented. The method may include providing current to a cathode-anode assembly horizontally positioned within an gas generator having a top interior surface, wherein a length of the cathode-anode assembly is arranged substantially parallel to the top interior surface. The method may also include rotating a first electrode of the cathode-anode assembly along a center axis of a length of the first electrode, the first electrode being rotated inside a second electrode of the cathode-anode assembly that surrounds the first electrode. The method may also include circulating electrolyte through the gas generator and the cathode-anode assembly, wherein the operation of the cathode-anode assembly generates the gas.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The present disclosure describes an array (plurality or set) of electrode rods (or arsenic rods or arsenic electrode rods) acting as sacrificial cathodes. In an example, each of the electrode rods is formed around a conductive metallic core, such as an iron core. Each of the electrode rods may be mounted with its axis horizontal to a surface such as a surface of a table, a floor, or the Earth (e.g., the electrode rods are horizontally mounted). Each of the electrode rods may be mounted within close proximity to a metallic anode. In some examples, each of the electrode rods may be shaped to minimize a variation in electrolyte spacing between an anode and a cathode. In some examples, each of the electrode rods may be shaped differently at an end of the electrode rod, where one or more gaps are provided in the electrode rod for electrolyte circulation and for gas generated from the electrode rod to escape.

Bubbles of gas (e.g., arsine or hydrogen) generated along the surfaces of the cathodes are provided with a direct path to gas collection at the top of the cell (described in more detail herein), that depends on angular position but not position along the rod length. Typically, electrochemical reactors employ electrodes that are not eroded or are eroded very slowly during gas generation. In contrast, the sacrificial cathodes described by the present disclosure are eroded whenever gas is generated, and their cost is a significant fraction of the total cost of operation. In vertical gas evolution surfaces, bubble formation and transport can be complex and dependent on vertical position within the reactor, leading to variations in effective voltage and current density with location, as described, for example, in Taqieddin et. al., J. Electrochem. Soc. V. 164 p. E448 (2017). Uniform erosion of arsenic cathodes may be difficult to achieve in these circumstances, leading to poor utilization of the arsenic cathode and greatly increased cost. In the exemplary horizontal arrangement of the electrodes, bubble formation and transport are substantially uniform along the length of the cathodes, promoting length-independent gas generation and cathode erosion.

In an aspect, each of the plurality of electrode rods may be supported on one or more rotatable fixtures to provide electrical contact and allow periodic or continuous rotation of the cathode rods within the anodes rods. Rotation of the electrode rods may ensure uniform azimuthal consumption of the arsenic material on the electrode rods thereby maximizing an overall arsenic utilization.

In an aspect, the plurality of electrode rods may be contained within a cell (structure or shell or case or body) formed of a nonreactive-coated metal, such as a polytetrafluoroethene (PTFE)-coated stainless steel, or other materials with similar characteristics or properties. The cell may be configured to provide an open region above the array of electrode rods through which electrolyte may be circulated. While the electrolyte is circulated, a continuous supply of electrolyte may be provided and filtered of precipitates and impurities that may accumulate in the electrolyte during operation.

In some examples, integral components, structures, and/or devices may be used for electrolyte pumps and electrode rotation without seals to rotating surfaces penetrating the envelope of the cell, to ensure safe operation at high pressure. Supplemental components, structures, and/or devices for recovery of arsine gas dissolved in the electrolyte may be incorporated into a circulation path.

In an aspect, the cell may be scalable to allow multiple cells to be connected in electrical series or parallel, and to employ either separate electrolyte reservoirs and pumps or a common single electrolyte distribution / purification system.

Figure 1A:
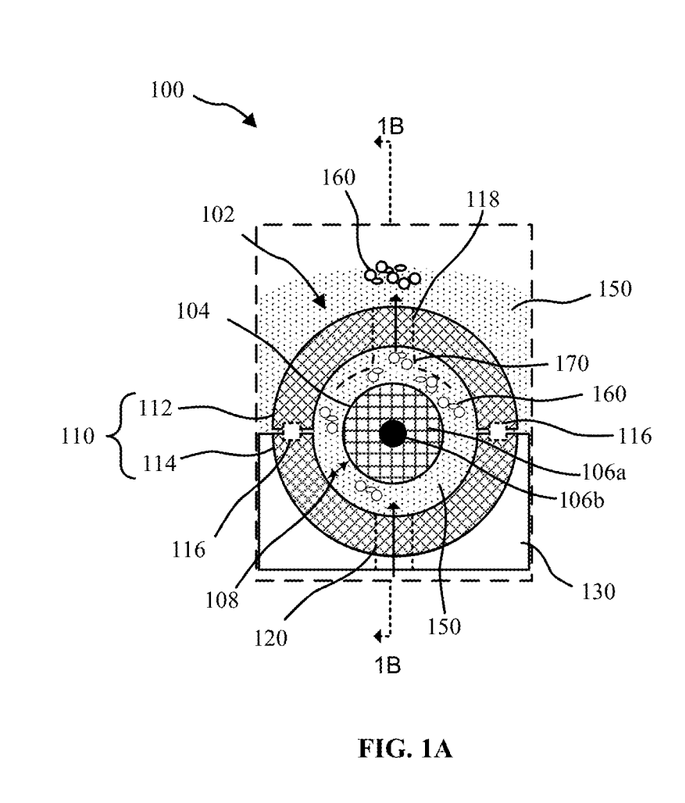
FIG. 1A illustrates an example of a cross-sectional side view of a cathode-anode assembly, according to aspects of the present disclosure.
Figure 1B:
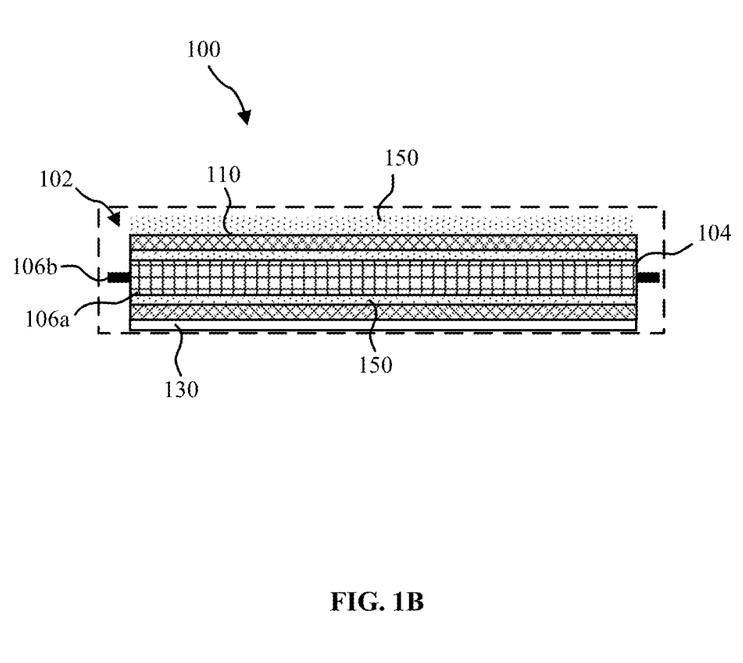
FIG. 1B illustrates an example of a cross-sectional side view of the cathode-anode assembly along the line 1B-1B of FIG. 1A, according to aspects of the present disclosure.

Referring to FIGS. 1A and 1B, views of an example of a cathode-anode assembly 102 of an gas generator 100 (or cell) is depicted. The gas generator 100 may be configured to generate gas (e.g., arsine) based on a current applied to the cathode-anode assembly 102 and a electrochemical reaction between a first electrode 104 (e.g., cathode) and a second electrode 110 (e.g., anode) of the cathode-anode assembly 102. As shown, the cathode-anode assembly 102 may be horizontal to a plane of the Earth (or substantially perpendicular to a general rising direction of gas bubbles 160 that result from the electrochemical reaction).

The first electrode 104 (arsenic rod, arsenic electrode rod) may be a sacrificial cathode, or a cathode that is consumed during generation of arsine, $AsH_3$ (i.e., operation of the gas generator 100). The first electrode 104 may include an outer layer 106a and a core 106b, where the outer layer 106a is deposited on at least a portion of the core 106b. In an example, the first electrode 104 may be in the form of a tube or rod. In an example, the first electrode 104 may be elongated, form a cylindrical structure, and/or form a concentric cylindrical structure, as shown by FIGS. 1A-1B. In an example, the first electrode 104 may have a diameter of 1.5 to 3 centimeters (cm) and a length of 30-80 cm.

In an aspect, the outer layer 106a may be formed of elemental arsenic (As). In an aspect, the core 106b may be configured to provide mechanical support, electrical contact, and/or rotational motion for the first electrode 104. In an example, the core 106b may be a solid or hollow core that extends the length of the first electrode 104 and, in some examples, past the ends of the outer layer 106a, as shown by FIG. 1B. The core 106b may be formed of a conductive-metallic material such as iron, stainless steel, or tungsten. In an example, the core 106b may have a diameter (e.g., 3 to 5 millimeters (mm) diameter) that is less than a diameter of the first electrode 104.

In an aspect, the cathode-anode assembly 102 may include the second electrode 110. In an example, the second electrode 110 may be a sacrificial anode, or an anode that oxidizes itself during generation of the gas (i.e., operation of the gas generator 100). The second electrode 110 may be formed of an oxidizable material or metal such as molybdenum, tungsten, or a hydrogen-oxidation anode. The second electrode 110 may form a hollow tube to surround the first electrode 104. In an example, the second electrode 110 may be elongated, form a cylindrical structure, and/or form a concentric cylindrical structure, as shown by FIGS. 1A-1B. The second electrode 110 may be spaced from the first electrode 104 to form a gap 108. In an example, an initial spacing of the gap 108 may be chosen to be as small as tolerances allow to reduce a voltage drop and power consumption during arsine generation. In an example, the second electrode 110 may be the about the same length as the first electrode 104 (and/or about the same length of the outer layer 106a), however, aspects of the present disclosure are not limited to these lengths. Instead, the second electrode 110 may be a length different (e.g., shorter or longer) from the length of the first electrode 104.

While the above descriptions have envisioned the use of a sacrificial anode (e.g., second electrode 110) such as molybdenum or tungsten, some examples of the cathode-anode assembly 102 may also be configured with any anode that does not evolve oxygen, such as a hydrogen-oxidation anode, using a sintered mixture of molybdenum and nickel or cobalt, as described for example in "Polarization of Cobalt-Molybdenum and Nickel-Molybdenum Hydrogen Electrodes for Alkaline Fuel Cells", C. Fan et. al., Int. J. Hydrogen Energy, v. 19, p. 529 (1994). The use of a molybdenum-based hydrogen-oxidation anode may provide the advantage of the anode will erode and release molybdate ions if a portion of the anode is not supplied with adequate hydrogen, but will not produce oxygen, thereby preserving the purity of the evolved arsine gas stream.

The second electrode 110 may include one or more channels (e.g., 118, 120) to allow the gas bubbles 160 to exit the cathode-anode assembly 102 and/or to allow for the electrolyte 150 to enter, circulate through, and exit the cathode-anode assembly 102. In an example, the one or more channels (e.g., 118, 120) may form circular apertures and/or elongated slots in the second electrode 110.

The gas bubbles 160 generated at the surface of the first electrode 104 will tend to rise due to their buoyancy relative to the electrolyte 150. If the gas bubbles 160 are transported to the surface of the second electrode 110, some gas (e.g., arsine) may be lost due to unintended oxidation; this phenomenon is known as crossover, which may be minimized by various measures. For example, a width of one or more of the first channels 118 may be increased, but this may impact the uniformity of consumption of the second electrode 110 and the current density thereon. The convective flow through the one or more of the second channels 120 may be increased, which will be effective if the gas bubbles 160 have small diameters. Hydrogen gas may be dispensed through the one or more of the second channels 120 to form gas bubbles that help displace the gas bubbles 160 from the surface of the second electrode 110, albeit at the possible cost of increasing the effective resistivity of the electrolyte 150.

In some aspects, a screen 170 may be placed to direct the flow of gas bubbles 160 towards the one or more first channels 118, as shown by FIG. 1A. Further, the screen 170 may be porous to allow the flow of the electrolyte 150 to circulate through the gap 108 with minimal impediment to transport of reactants and ions. In an example, the porosity of the screen 170 may be chosen to minimize an impediment of the transport of hydroxyl ions from the first electrode 104 to the second electrode 110. Examples of the screen 170 may include, a mesh, a polymer sheet with one or more openings, a permeable membrane, or an ion-conductive porous membrane. In an example, the screen 170 includes one or more supporting members (not shown) to retain the screen 170 in a fixed position within the gap 108.

In some examples, the second electrode 110 may include a first segment 112 (upper segment) and a second segment 114 (lower segment). The second electrode 110 may include one or more alignment pins 116 or other provisions to ensure mechanical position of the first segment 112 with the second segment 114 and electrical continuity between the first segment 112 and the second segment 114. In an example, the alignment pins 116 may be supplemented by polymeric or other seals to prevent flow of the electrolyte 150 in a region between the first segment 112 and the second segment 114.

The first segment 112 may include one or more first channels 118 to allow for the gas bubbles 160, generated during the operation of the gas generator 100, to escape from the gap 108 and be collected in the gas generator 100.

In some examples, an exterior surface of the second electrode 110 may be covered by a PTFE (e.g., Teflon) or other protective films to minimize corrosion from the electrolyte 150

In an example as illustrated in FIGS. 1A and 1B, the cathode-anode assembly 102 may be at least partially submerged in electrolyte 150 and the gap 108 may contain the electrolyte 150. In an example, the electrolyte 150 may be formed of a conductive material suitable for generation of gas (e.g., arsine) such as potassium hydroxide (KOH), sodium hydroxide (NaOH), lithium hydroxide (LiOH), or Caesium hydroxide (CsOH). Further, the electrolyte 150 may optionally contain various additives, such as surfactants, ammonium hydroxide (NH4OH), and/or coordinating agents, such as ethylene diamine tetraacetate (EDTA), chosen to optimize performance in generating arsine.

The electrolyte 150 may provide temperature control of the cathode-anode assembly 102 and remove contaminants, generated during the operation of the gas generator 100, from the gap 108. As explained in more detail below, the electrolyte 150 may be circulated through the cathode-anode assembly 102 via the one or more first channels 118 of the first segment 112 and one or more second channels 120 of the second segment 114. As shown by FIG. 1A, in an example, the electrolyte 150 may flow into the gap 108 via the one or more second channels 120 and exit the gap 108 via the one or more first channels 118. Other flow patterns, however, may also be implemented.

In some examples, the gas generator 100 may also include a base 130 configured to support the cathode-anode assembly 102. For example, as shown by FIG. 1A, the support base 130 may be positioned below the second electrode 110 (e.g., below the second segment 114 of the second electrode 110). In addition to, or aside from, supporting the cathode-anode assembly 102, the one or more second channels 120 may extend into the support base 130 such that the electrolyte 150 may flow into the cathode-anode assembly 102 via the support base 130.

Based on implementations of the present disclosure, gas bubbles 160 (e.g., arsine or hydrogen bubbles) generated along the surface of the outer layer 106a of the first electrode 104 may be provided with a path to gas collection at the top of a shell (described in more detail below) via the cathode-anode assembly 102. In comparison with vertically placed cathodes/anodes, which may result in complex bubble formation and transport and may be dependent on vertical position of the cathodes/anodes within a generator, leading to variations in effective voltage and current density with location, implementations of the present disclosure allow bubble formation and transport to be substantially similar along the length of the cathode-anode assembly 102, promoting length-independent gas generation and cathode erosion.

While examples of sizes and dimensions of the cathode-anode assembly 102 and components of the cathode-anode assembly 102 are described herein, the selection of the dimensions of the cathode-anode assembly 102 and respective component elements may proceed from the following considerations. In the discussion below, the following notation is adopted:

$R_c$=radius of the core 106b;
$R_{oi}$=initial radius of the outer layer 106a;
$R_{of}$=final radius of the outer layer 106a when a maximum allowed consumption of the cathode is reached;
$H_o$=length of the outer layer 106a exposed to the electrolyte 150;
$N_{rod}$=number of cathode-anode assemblies 102 in a single gas generator 100;
MWT(AsH3)=molecular weight of arsine—approximately 77.95 g/mol;
MWT(As)=molecular weight of arsenic—approximately 74.92 g/mol;
$Q(AsH_3)$=total mass of arsenic that could be produced before replacement of the first electrode 104;
$F_{std}(AsH_3)$=output flow of arsine in standard liters per minute;
$RTP_0$=conversion constant from standard liters per minute to moles per second, about $7.4 \times 10^4$;
$Y(AsH_3)$=% of $AsH_3$ in the produced mixture of $AsH_3$: $H_2$;
$I_{gen}$=total generation current provided to all the cathode-anode assemblies 102 of a single gas generator 100, where the current supplied to the various cathode-anode assemblies 102 is treated as electrically in parallel;
$n_e$=number of electrons required to produce an arsine molecule, 3 in this case; and
F=Faraday constant—approximately 96,480 Coulombs/mole.

The largest quantity of arsine that may be produced by a gas generator 100 before replacement of the first electrode 104 is needed is based on the following equation:

$$Q(AsH_3)[kg] = \rho_{As}\pi(R_{oi}^2 - R_{of}^2)H_0 N_{rod} \frac{MWT(AsH_3)}{MWT(As)}$$

The current required to produce a given output flow of arsine, assuming the yield Y is known, is based on the following equation:

$$I_{gen} = n_e F \, F_{std} \frac{RTP_0}{Y(AsH_3)}$$

The exposed surface area at the start of process with a new set of first electrodes 104 is based on the following equation:

$$A_{si} = 2\pi R_{oi} H_0 N_{rod}$$

The corresponding surface area at the termination of processing with a given set of cathode-anode assemblies 102 is based on the following equation:

$$A_{sf} = 2\pi R_{of} H_0 N_{rod}$$

The initial current density at the first electrode 104 is based on the following equation:

$$J_{ci} = \frac{I_{gen}}{A_{si}}$$

at the initiation of processing with a new set of first electrodes 104, and $$J_{cf} = \frac{I_{gen}}{A_{sf}}$$

at the termination of processing with that set of cathode-anode assemblies 102. The procedure for determining the dimensions of the reactor elements is then:

(A) Set constraints on the design based on final performance requirements. In an example, such requirements might be the maximum allowed size for the generator envelope based on the facility in which it will be installed, the largest arsenic samples the vendor can fabricate, the uptime requirements of the use facility, and the flow requirements of MOCVD processes. From these external limitations, one may obtain the maximum allowed length of a single rod maximum allowed radius $R_{oi}$ required total output arsine before rod change $Q(AsH_3)$, required output flow rate $F_{std}$.

(B) Establish the maximum allowed current density from experiment or simulation for the specific geometry in use and measure the arsine yield at that current density.

(C) Establish the required current Igen from Fstd for the arsine yield measured above.

(D) From the requirement on $Q(AsH_3)$, the allowed starting radius $R_{oi}$, and the maximum allowed value of $H_c$, determine the number of rods $N_{rod}$.

(E) Determine the radius at which processing of the rod set is terminated, $R_{of}$, from the current density constraint $J_{cf}$.

(F) Set the core radius $R_c$, to be slightly less than $R_{of}$, such as 90% of $R_{of}$.

(G) Choose the inner diameter of the anode (e.g., second electrode 110) to create a channel (e.g., gap 108) sufficiently large at the initiation of processing with a new set of rods (e.g., first electrode 104) to permit the target minimum electrolyte flow.

Figure 2A:
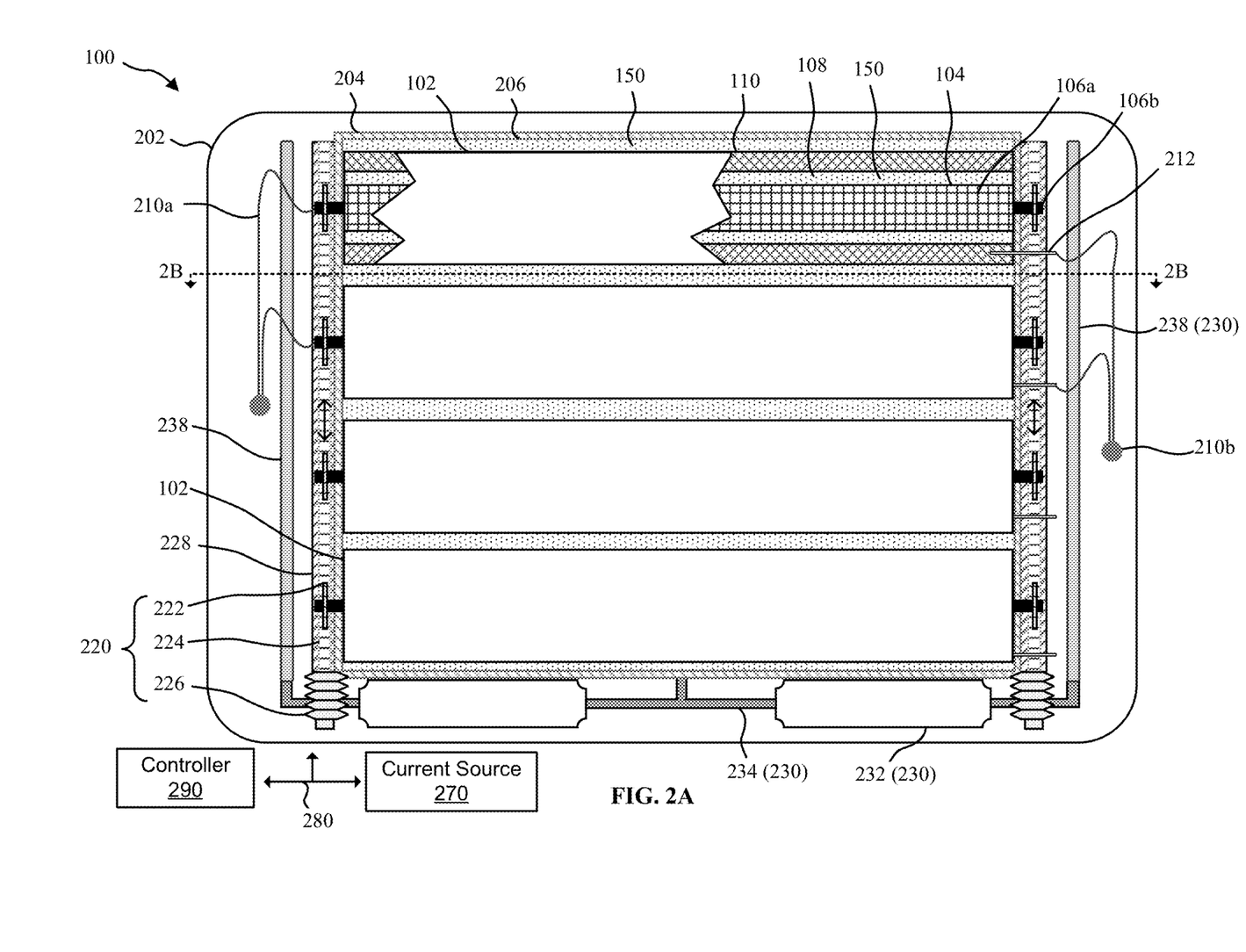
FIG. 2A illustrates an example of a top-down view of a system for arsine generation including the cathode-assembly of FIGS. 1A-1B, according to aspects of the present disclosure.
Figure 2B:
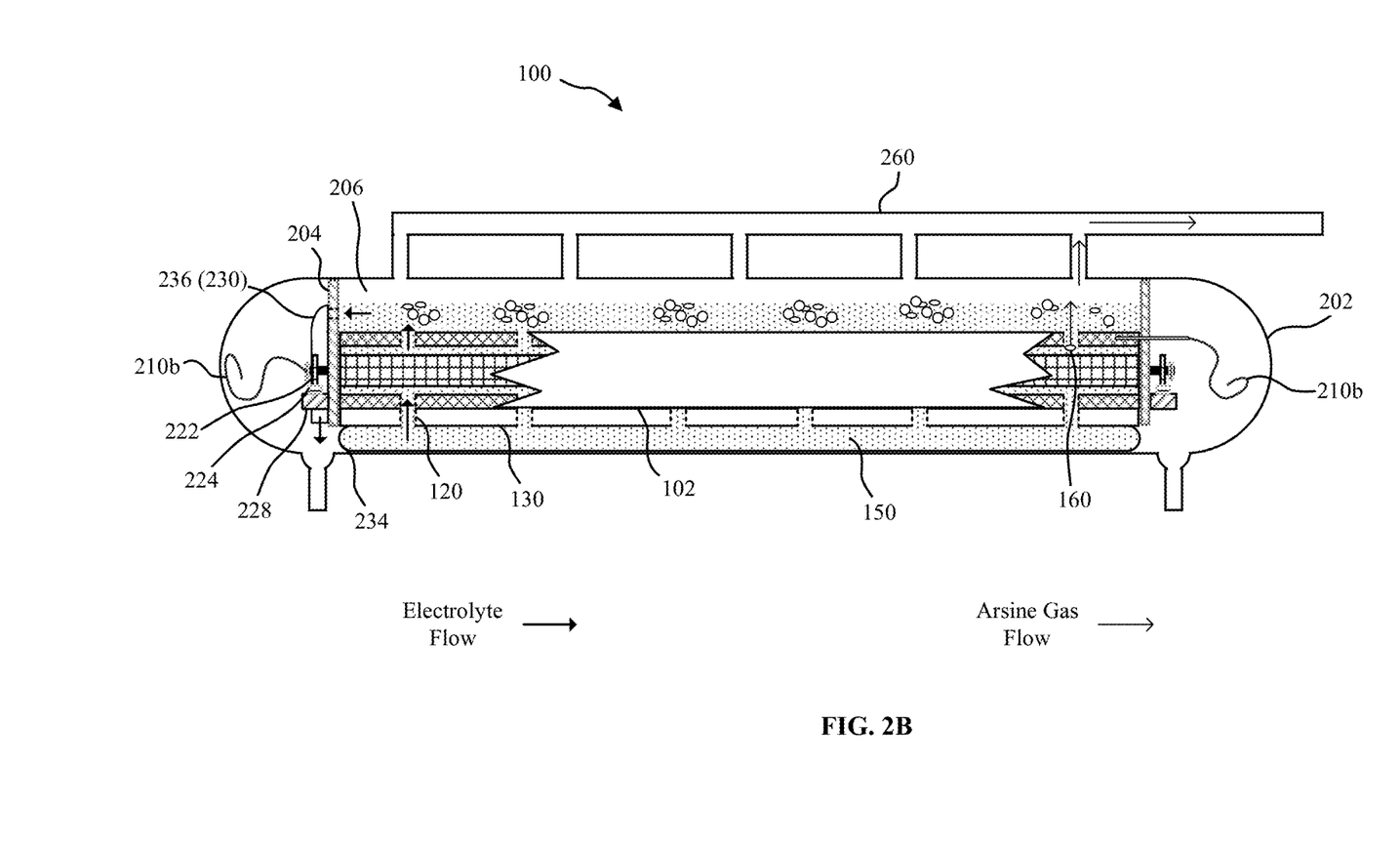
FIG. 2B illustrates an example of a side view of the system for arsine generation along the line 2B-2B of FIG. 2A, according to aspects of the present disclosure.
Figure 2C:
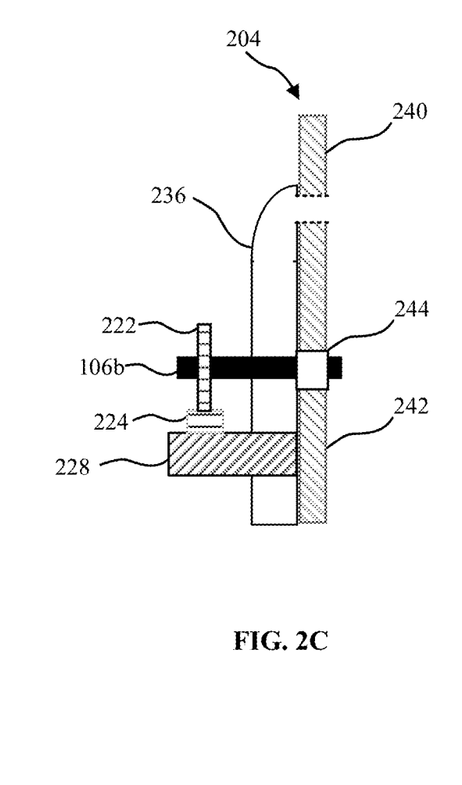
FIGS. 2C-2D illustrate examples of a rotation system for the system of arsine generation of FIGS. 2A-2B, according to aspects of the present disclosure.
Figure 2D:
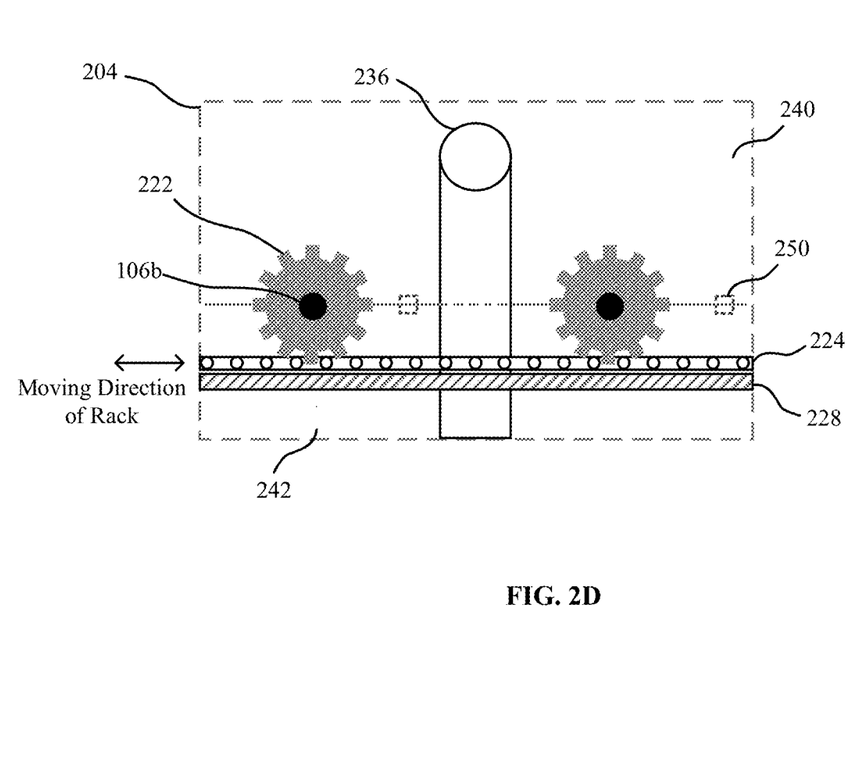

Referring to FIGS. 2A-2D, different views of an example of the gas generator 100 are depicted. FIG. 2A illustrates a top-down view of an example of the gas generator 100, FIG. 2B illustrates a cross-sectional side view of the example of the gas generator 100 of FIG. 2A along the line 2B-2B, and FIGS. 2C and 2D illustrate a cross-sectional side views of an example of a rotational system 220 of the gas generator 100 of FIG. 2A.

As shown in FIG. 2A, the gas generator 100 may include an outer shell 202 (housing, case, or container) forming a housing with a cavity configured to contain the contents of the gas generator 100. The outer shell 202 may be constructed of one or more materials suitable for use with high differential pressure, such as stainless steel. In an example, at least the inside surface of the outer shell 202 may be coated with PTFE (e.g., Teflon) or other protective films to minimize corrosion from the electrolyte 150.

The gas generator 100 may also include partition walls 204 to form an isolated area 206 within the outer shell 202. The isolated area 206 may be configured to isolate (or seal or contain) one or more of the cathode-anode assemblies 102 and the electrolyte 150 from remaining areas within the outer shell 202. The partition walls 204 may be formed of a stainless steel material or other material that is not corroded by contact with the electrolyte 150. The partition walls 204 may contain openings for the cores 106b of each of the first electrodes 104 and conductor rods 212 of each of the second electrodes 110 to pass through. In an example, any equivalent means of making electrical contact to the second electrodes 110 may be used, including, but not limited to, using mechanical supports for the second electrodes 110 as ground connections. In the case of using mechanical supports, a positive potential may be held at ground and the first electrodes 104 may be held at a negative potential with respect to ground. Gaskets 244 (see e.g., FIG. 2C), such as PTFE gaskets or other suitable gaskets, may be used in the openings of the partition walls 204 to allow rotation of the cores 106b and to prevent or minimize electrolyte leakage to the remaining areas within the outer shell 202.

As shown by FIG. 2D, in some examples, the partition walls 204 may be assembled from multiple sections such as a first section 240 and a second section 242 (e.g., upper and lower sections) to allow assembly of the cathode rods. In an example, one or more alignment pins 250 or other means may be provided to ensure accurate assembly of the multiple sections of the partition walls 204. In some examples, a region between the first section 240 and the second section 242 of the partition walls 204 may include a flexible gasket or other means for preventing leakage of the electrolyte 150.

In an aspect, each of the first electrodes 104 and the second electrodes 110 may couple with one or more electrical cables 210a and 210b (or wires). In an example, the electrical cables 210a may couple with ends of the cores 106b to provide a flow of current to the first electrodes 104 during gas generation, and the electrical cables 210b may couple with the conductor rods 212 to return the current to the current source 270 during gas generation. While only one end of the first electrodes 104 and one end of the second electrodes 110 are shown as being connected to the electrical cables 210a and 210b, aspects are not limited to this configuration. Instead, other configurations may be used, for example, both ends of the first electrodes 104 and the second electrodes 110 may couple with the electrical cables 210a and 210b, respectively, to reduce the effect of series resistances. Further, while only some of the first electrodes 104 and the second electrodes 110 are illustrated as being coupled with the electrical cables 210a and 210b, respectively, each cathode-anode assembly 102 may be coupled with the electrical cables 210a and 210b.

In an aspect, each of the first electrodes 104 may be rotationally coupled to a rotational system 220 (see e.g., FIG. 2A). Rotation of the first electrodes 104 may ensure uniform erosion in azimuth around a surface of the first electrodes 104. In an example, the rotational system 220 may rotate the first electrodes 104 at a rate comparable to a rate at which the first electrodes 104 are consumed. In some examples, the rotational system 220 may rotate the first electrodes 104 continuously during gas generation, or in periodic steps. In some examples, by limiting the extent of rotation to a small number of approximate multiples of degrees (e.g., 15, 30, 45, 60, 90 or 180), symmetric erosion around the first electrodes 104 may be obtained while minimizing the stress on the electrical cables 210a, allowing simple provisions for electrical connection without the need for sliding or rotating contacts between the electrical cables 210a and the first electrodes 104.

In an aspect, the rotational system 220 may include a rack-and-pinion system, as shown, to provide rotation movement of the first electrodes 104. In an example, the rotational system 220 may include one or more drive gears 222, racks 224, and/or bellows 226 for rotational movement (see e.g., FIGS. 2A-2D). The drive gears 222 may couple with one or more ends of the cores 106b, and the racks 224 may rotationally engage the drive gears 222 to rotate the first electrodes 104. The bellows 226 may cause the racks 224 to move linearly. In an example, the bellows may cause to racks 224 to move linearly in a first direction and then linearly in a second direction opposite the first direction. The bellows 226 may include a bellows-sealed impeller in order to avoid rotating seals between the isolated area 206 containing the generated gas and other portions of the gas generator 100. The extent of linear motion of the racks 224 may be selected to ensure uniform azimuthal consumption of the first electrodes 104. If consumption of the first electrode 104 is bilaterally symmetric with respect to the vertical direction, 180 degrees or less of rotation of the first electrodes 104 may be sufficient. Multiples of degrees (e.g., 15, 30, 45, 60, 90 or 180) may also be employed to account for asymmetries in the construction or operation of the cathode-anode assemblies 102.

In an aspect, the rotational system 220 may also include one or more rack supports 228 configured to provide support for the racks 224. In an example, the rack supports 228 may mount to or be a part of the partition walls 204. However, in other examples, the rack supports 228 may be mounted to a base of the gas generator 100.

As previously described, the initial spacing of the gap 108 may be chosen to be as small as tolerances allow to reduce a voltage drop and power consumption during operation. During arsine generation, the first electrode 104 may be consumed. If the first electrode 104 orientation was fixed during operation, consumption of the first electrode 104 would vary with respect to an angle from the vertical, due to mass transport within the electrolyte 150, non-uniform bubble accumulation, variations in temperature, and other asymmetries. However, the rotational system 220 may allow rotation of the first electrodes 104 while the second electrodes 110 remain fixed.

Accordingly, the rotational system 220 may ensure uniform erosion or consumption of the first electrodes 104 and provide maximal utilization of the elemental arsenic on the first electrodes 104 with minimum changes in performance of the gas generator 100.

During operation, the second electrodes 110 may also erode or be consumed. However, a radius of the first electrode 104 decreases due to erosion of arsenic, which may reduce an exposed surface area of the first electrode 104 and increase the current density, whereas internal radius of the second electrode 110 may increase, which may increase an exposed surface area of the second electrode 110 and reduce the current density. Accordingly, the decrease of surface area of the first electrode 104 may dominate the change in a size of the gap 108 and behavior of the gas generator 100.

In an aspect, the gas generator 100 may also include an electrolyte circulation system 230 (see e.g., FIG. 2A) configured to circulate or distribute the electrolyte 150 uniformly through the gas generator 100 and remove or clean particulates or contaminants generated during the operation of the gas generator 100 from the cathode-anode assembly 102. The electrolyte circulation system 230 may also maintain control of composition (by adding one or more additives to the electrolyte 150 and/or filtering contaminants) and control of temperature of the electrolyte 150 in the cathode-anode assembly 102.

The electrolyte circulation system 230 may include one or more pumps/filters 232 to pump the electrolyte into the isolated area 206 and to filter the electrolyte 150 that exits the isolated area 206. In an example, the pumps/filters 232 may control circulation of the electrolyte 150. The pumps/filters 232 may be located outside of the isolated area 206, as shown. In an example, the pumps/filters 232 may be electrically driven and controlled to avoid use of rotating seals, or the pumps/filters 232 may include magnetically-coupled pumps. In some examples, the pumps/filters 232 may filter the electrolyte 150 to remove any particulates from the electrolyte 150. In an some examples, the gas generator 100 may include one or more reservoirs (not shown) to add one or more compounds to the electrolyte 150 via the pumps/filters 232. For example, the pumps/filters 232 may incorporate a reservoir to add potassium hydroxide, or any other appropriate solute, to the electrolyte 150 during arsine generation to compensate for the consumption of hydroxide resulting from the formation of potassium molybdate.

In an example, the electrolyte circulation system 230 may include one or more electrolyte supply lines 234 which may receive the electrolyte 150 from the pump/filters 232 and provide the electrolyte 150 to the cathode-anode assemblies 102 via the one or more second channels 120. As shown by FIG. 2B, the electrolyte supply lines 234 may be positioned below the support base 130.

The electrolyte circulation system 230 may also include one or more electrolyte drains 236, which provide an opening for the electrolyte 150 to drain from the isolated area 206. In operation, the pumps/filters 232 may push the electrolyte 150 up through the cathode-anode assembly 102 such that the electrolyte 150 may pass into the space above the cathode-anode assemblies 102 and drain through the electrolyte drains 236.

The electrolyte circulation system 230 may also include one or more electrolyte return lines 238, which may receive the electrolyte 150 from the electrolyte drains 236 and provide the electrolyte 150 to the pumps/filters 232.

In an aspect, the gas generator 100 may also include gas vents 260 which provide a path for the generated gas to leave the outer shell 202. In an example, the gas vents 260 are connected to one or more gas reservoirs or tanks (not shown) for storing the generated gas. In an example, the gas vents 260 may be coupled to demisting and purification modules (not shown) for removing water vapor and other contaminants from the gas stream.

In an aspect, the gas generator 100 may also include a current source 270 (see e.g., FIG. 2A) configured to provide current to each of the cathode-anode assemblies 102. In an example, the current source 270 may couple with each of the cores 106b of the first electrodes 104 via the electrical cables 210a and with each of the second electrodes 110 via the conductor rods 212 and the electrical cables 210b. The current source 270 may include a positive connection and a negative connection. In an example, the positive connection of the current source 270 may couple with the first electrodes 104 and the negative connection of the current source 270 may couple with the second electrodes 110. In this arrangement, during gas generation, current may flow from the positive connection of the current source 270 towards the negative connection of the current source 270 via the electrical cables 210a, the first electrodes 104, the second electrodes 110, the conductor rods 212, and the electrical cables 210b. In an example, the current source 270 may be mounted to the outer shell 202 (either interior or exterior), or located external to the outer shell 202.

In an aspect, the gas generator 100 may also include a controller 290 (see e.g., FIG. 2A) for controlling one or more components of the gas generator 100 including the rotational system 220, the electrolyte circulation system 230, and/or the current source 270. The controller 290 may be electrically coupled with the components via one or more buses 280. In an example, the controller 290 may cause the current source 270 to provide current to the cathode-anode assembly 102. The current may cause an electrochemical reaction between the first electrode 104 and the second electrode 110 to generate gas. In another example, the controller 290 may control the bellows 226 of the rotational system 220 to cause the racks 224 to move and the first electrode 104 to rotate. In another example, the controller 290 may control the pumps/filters 232 of the electrolyte circulation system 230 to circulate the electrolyte through the cathode-anode assemblies 102. In an example, the controller 290 may be mounted to the outer shell 202 (either interior or exterior), or located external to the outer shell 202.

While the present disclosure discloses a single gas generator 100, aspects of the present disclosure are not limited to being a single gas generator 100. Instead, a plurality of gas generators 100, including gas generators 100 of varying numbers and sizes, may be interconnected to provide larger arsine generation capacities than a single gas generator 100.

Further, the gas generator 100 may include additional features for facilitating the generation and removal of the generated gas. For example, the gas generator 100 may also include a demisting device (not shown) configured to remove and return electrolyte droplets captured within the outer shell 202. The demisting device may be positioned at the top of the cavity of the outer shell 202 or in the gas vents 260. In some examples, the gas generator 100 may include a means for purging the gas generator 100 and the electrolyte 150 before use to remove air or oxygen, and after use to remove toxic gases. In some examples, the gas generator 100 may also include a temperature controller (not shown) to control an external temperature of a surface temperature of the outer shell 202 over a sufficiently large area exposed to the electrolyte 150 (e.g. bottom of outer shell 202). In some examples, the gas generator 100 may also include a gas purifier (not shown) to purify the arsine gas by removing water vapor and/or contaminants from the generated arsine gas. In some examples, the gas generator 100 may also include a gas injector (not shown) to provide an additional gas such as hydrogen to be combined with the generated gas.

While the overall pressure of the gas generator 100 may be controlled by varying the electrical current provided to the gas generator 100 to control the rate of gas generation, the gas injector may ensure constant composition of the delivered gas stream.

Figure 3:
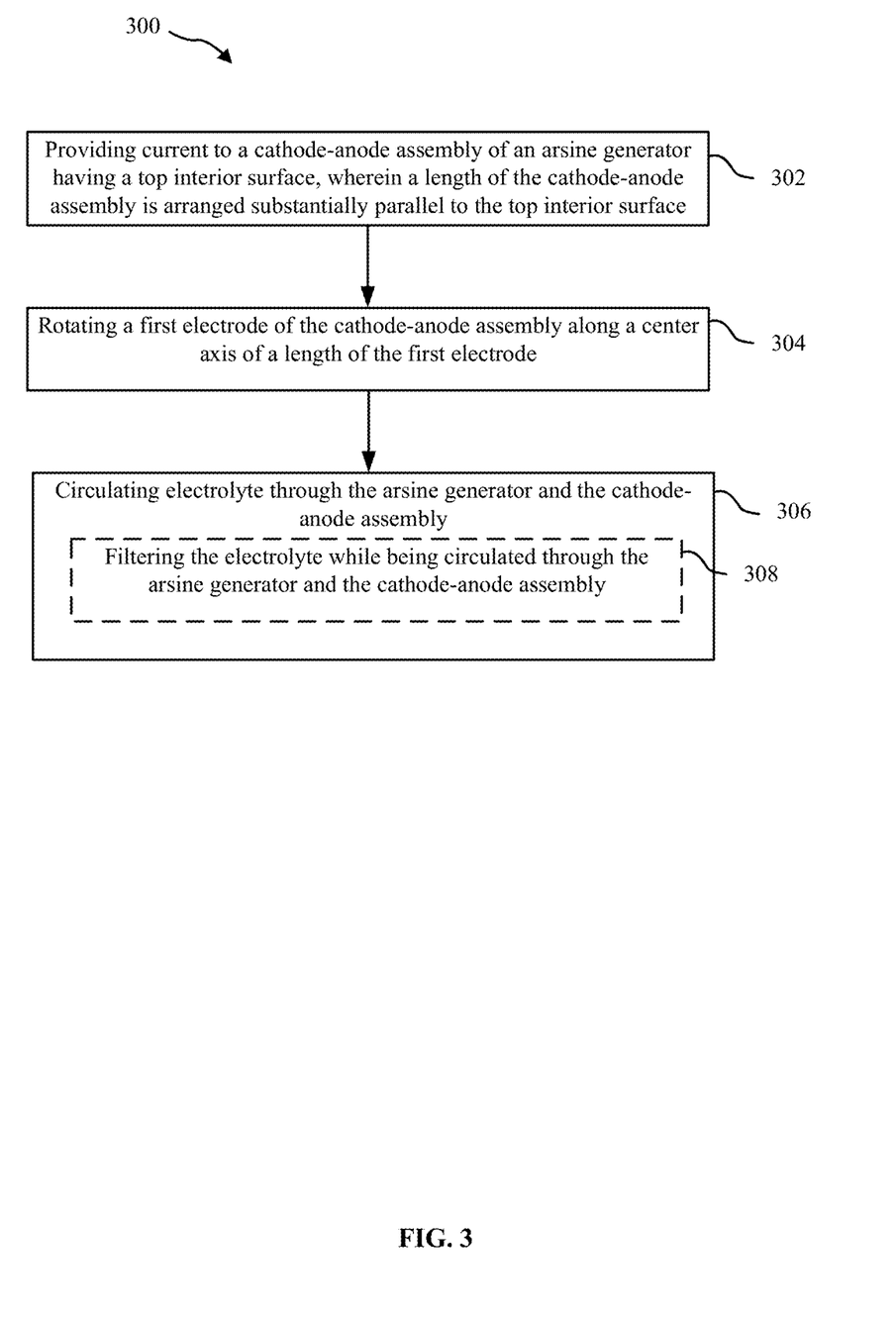
FIG. 3 illustrates an example of a method of generating arsine, according to aspects of the present disclosure.

Referring to FIG. 3, an example of a method 300 for generating arsine by the gas generator 100 according to aspects of the present disclosure is illustrated. Various aspects of the method 300 may be controlled or coordinated by, for example, the controller 290, which may include one or more processors and/or one or more memories with instructions to coordinate the operations of the gas generator 100.

At 302, the method 300 may include providing current to a cathode-anode assembly of an gas generator having a top interior surface, wherein a length of the cathode-anode assembly is arranged substantially parallel to the top interior surface. For example, the controller 290 may control the current source 270 to provide the current to the cathode-anode assembly 102. In an example, the current source 270 may provide the current to the first electrode 104 via the electrical cable 210a and the current may return to the current source 270 via the second electrode 110, the conductor rods 212, and the electrical cable 210b.

At 304, the method 300 may include rotating a first electrode of the cathode-anode assembly along a center axis of a length of the first electrode. For example, the controller 290 may control the rotational system 220 to rotate the first electrode 104 via the core 106b. In an example, the rotational system 220 may include the one or more bellows 226 which linearly moves the rack 224 causing the drive gear 222, coupled with the first electrode 104 via the core 106b, to rotate. In an example, the controller 290 may continually rotate the first electrode 104. In another example, the controller 290 may rotate the first electrode 104 according to a periodic step.

At 306, the method 300 may include circulating electrolyte through the gas generator 100 and the cathode-anode assembly. For example, the controller 290 may control the electrolyte circulation system 230 to circulate the electrolyte 150 through the gas generator 100 and the cathode-anode assembly 102. In an example, controller 290 may control the pumps/filters 232 to circulate the electrolyte 150. The pumps/filters 232 may pump the electrolyte 150 to the cathode-anode assembly 102 via the electrolyte supply line 234 and the one or more second channels 120. The electrolyte may be pushed around the first electrode 104 and through the one or more first channels 118 to an exterior of the cathode-anode assembly 102. The electrolyte 150 may then drain via the one or more drains 236 to the one or more electrolyte return lines 238, which returns the electrolyte to the pumps/filters 232.

At 308, the method 300 may optionally include filtering the electrolyte. For example, the controller 290 may control the electrolyte circulation system 230 to filter the electrolyte 150 while being circulated through the gas generator 100 and the cathode-anode assembly 102. In an example, the pumps/filters 232 may filter the electrolyte 150.

It is understood that the specific order or hierarchy of blocks in the processes/flowcharts disclosed is an illustration of exemplary approaches. Based upon different implementations, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A gas generator comprising:
   a shell having a top interior surface and a bottom interior surface opposite the top interior surface; and
   a cathode-anode assembly horizontally positioned in the shell and forming an elongated structure substantially parallel to the top interior surface and the bottom interior surface, the cathode-anode assembly comprising:
   a first electrode including a layer of elemental arsenic; and
   a second electrode surrounding the first electrode and forming a gap between the second electrode and the first electrode, the second electrode including a plurality of channels along a length of the second electrode, one or more first channels of the plurality of channels being open towards the top interior surface of the shell,
   wherein the plurality of channels allow circulation of electrolyte within and around at least a portion of the cathode-anode assembly, and the one or more first channels allow gases, generated in response to current applied to the cathode-anode assembly and directed towards the one or more first channels, to escape from the cathode-anode assembly.

2. The gas generator of claim 1, wherein the second electrode is formed of an oxidizable metallic material.

3. The gas generator of claim 2, wherein the oxidizable metallic material includes one or more of molybdenum or tungsten.

4. The gas generator of claim 1, wherein the second electrode comprises a plurality of segments, wherein a first segment of the plurality of segments includes the one or more first channels, and wherein a second segment of the plurality of segments includes one or more second channels of the plurality of channels open towards the bottom interior surface of the shell.

5. The gas generator of claim 1, further comprising:
one or more partition walls to form an isolated area within the shell, wherein the cathode-anode assembly is positioned within the isolated area.

6. The gas generator of claim 5, wherein the one or more partition walls include a plurality of sections.

7. The gas generator of claim 1, further comprising:
a rotation system configured to rotate the first electrode along a center axis of a length of the first electrode.

8. The gas generator of claim 7, wherein the rotation system rotates the first electrode at a rate comparable to a rate at which the first electrode is consumed.

9. The gas generator of claim 7, wherein the rotation system rotates the first electrode a number of degrees in a first direction and rotates the first electrode the number of degrees in a second direction.

10. The gas generator of claim 1, further comprising:
an electrolyte circulation system configured to circulate the electrolyte within the gas generator and the cathode-anode assembly.

11. The gas generator of claim 10, wherein the electrolyte circulation system comprises:
a supply line to supply the electrolyte to one or more second channels of the plurality of channels open towards the bottom interior surface of the shell; and
a pump configured to circulate the electrolyte through the supply line and the cathode-anode assembly.

12. The gas generator of claim 11, wherein the electrolyte circulation system further comprises:
a drain configured to drain the electrolyte from the shell, wherein the pump receives the electrolyte from the drain.

13. The gas generator of claim 10, wherein the electrolyte circulation system comprises:
a filter configured to remove one or more particulates from the electrolyte during circulation of the electrolyte.

14. The gas generator of claim 1, further comprising:
a gas vent configured to provide a path for the gases generated during operation of the gas generator to leave the shell.

15. The gas generator of claim 1, further comprising:
a plurality of cathode-anode assemblies including the cathode-anode assembly.

16. The gas generator of claim 1, wherein one or more of the first electrode or the second electrode form an elongated structure.

17. The gas generator of claim 1, wherein one or more of the first electrode or the second electrode form a cylindrical structure.

18. The gas generator of claim 1, wherein the first electrode and the second electrode form a concentric cylindrical structure.

19. A gas generator comprising:
a shell having a top interior surface and a bottom interior surface opposite the top interior surface; and
a cathode-anode assembly horizontally positioned in the shell and forming an elongated structure substantially parallel to the top interior surface and the bottom interior surface, the cathode-anode assembly comprising:
a first electrode; and
a second electrode surrounding the first electrode and forming a gap between the second electrode and the first electrode, the second electrode including a plurality of channels along a length of the second electrode, one or more first channels of the plurality of channels being open towards the top interior surface of the shell,
wherein the first electrode is a cathode and comprises an outer layer formed of elemental arsenic and a core formed of a metallic material, and wherein the second electrode is an anode, and
wherein the plurality of channels allow circulation of electrolyte within and around at least a portion of the cathode-anode assembly, and the one or more first channels allow gases, generated in response to current applied to the cathode-anode assembly and directed towards the one or more first channels, to escape from the cathode-anode assembly.

20. The gas generator of claim 19, wherein the metallic material is iron.

* * * * *